United States Patent
Kim

(10) Patent No.: US 8,843,697 B2
(45) Date of Patent: Sep. 23, 2014

(54) OPERATING METHOD OF DATA STORAGE DEVICE

(75) Inventor: Eui Jin Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 201 days.

(21) Appl. No.: 13/602,276

(22) Filed: Sep. 3, 2012

(65) Prior Publication Data

US 2013/0346676 A1 Dec. 26, 2013

(30) Foreign Application Priority Data

Jun. 25, 2012 (KR) .......................... 10-2012-0067834

(51) Int. Cl.
   *G06F 13/10* (2006.01)
   *G06F 12/02* (2006.01)
(52) U.S. Cl.
   CPC .... *G06F 12/0246* (2013.01); *G06F 2212/7211* (2013.01)
   USPC ........................................................ 711/103

(58) Field of Classification Search
   None
   See application file for complete search history.

(56) References Cited

U.S. PATENT DOCUMENTS

2007/0061502 A1* 3/2007 Lasser et al. .................. 711/103

FOREIGN PATENT DOCUMENTS

| KR | 100771521 B1 | 10/2007 |
| KR | 1020080074584 A | 8/2008 |

* cited by examiner

*Primary Examiner* — Duc Doan
(74) *Attorney, Agent, or Firm* — William Park & Associates Patent Ltd.

(57) ABSTRACT

Provided is an operating method of a data storage device including a plurality of nonvolatile memory devices. The operating method includes the steps of: dividing storage areas of the nonvolatile memory devices into a first memory area and a second memory area; determining wear levels of each of the first memory area and the second memory area; and varying a ratio of the first memory area and the second memory area according to the determined wear levels.

20 Claims, 10 Drawing Sheets

$$\text{Optimized Lifetime Ratio(OLR)} = \frac{\text{MLC Lifetime (Lm)}}{\text{SLC Lifetime (Ls)}} \times \frac{\text{SLC Avg. E/W Count (Ms)}}{\text{MLC Avg. E/W Count (Mm)}}$$

|  | OLR < 1 | OLR = 1 | OLR > 1 |
|---|---|---|---|
| State | High Mm | Normal Ms and Mm | High Ms |
| Action | Increase MLC area (Decrease SLC area) | – | Increase SLC area (Decrease MLC area) |

OPERATING METHOD OF DATA STORAGE DEVICE

CROSS-REFERENCES TO RELATED APPLICATION

The present application claims priority under 35 U.S.C. §119(a) to Korean application number 10-2012-0067834, filed on Jun. 25, 2012, in the Korean Intellectual Property Office, which is incorporated herein by reference in its entirety.

BACKGROUND

1. Technical Field

The present invention relates to a data storage device, and more particularly, to a method for managing a storage area of a data storage device.

2. Related Art

Recently, use of computing devices has become more ubiquitous leading to a computing environment in which computer systems are used anytime and anywhere. Accordingly, the use of portable electronic devices such as mobile phones, digital cameras, and notebook computers has rapidly increased. In general, these portable electronic devices use a data storage device using memory devices. The data storage device is used as a main memory device or a secondary memory device of the portable electronic device.

The data storage device using memory devices includes no mechanical driver. Thus, the data storage device has excellent stability and durability, exhibits a high information access speed, and has small power consumption. The data storage device having such advantages may include a USB (Universal Serial Bus) memory device, a memory card having various interfaces, a solid state drive (SSD) and the like.

As more and more portable electronic devices are used for storing large files such as music files and video files, the data storage device is required to have a large storage capacity. The data storage device includes a plurality of memory devices to increase storage capacity. In the data storage device including a plurality of memory devices, a high operating speed as well as a large storage capacity is one of the important characteristics of the data storage device.

The data storage device may include a plurality of memory devices to secure a large storage capacity. In particular, the data storage device may include multi-level cell memory devices capable of storing two or more-bits of data per cell. In some cases, the data storage device including multi-level cell memory devices may use a buffer program method to secure a high operation speed. For example, the multi-level cell memory device of the data storage device may be divided into a buffer area and a main area. Furthermore, the data storage device may program input data into the buffer area, and then program the data programmed in the buffer area into the main area during an idle time.

In the data storage device using the buffer program method, when any one of the buffer area and the main area is worn, it may have an effect on the lifetime or reliability of the data storage device. Therefore, it is very important to manage the wear level of these areas.

SUMMARY

An operating method of a data storage device, which manages the wear levels of storage areas programmed through different program methods, is described herein.

In one embodiment of the present invention, there is provided an operating method of a data storage device including a plurality of nonvolatile memory devices. The operating method includes the steps of: dividing storage areas of the nonvolatile memory devices into a first memory area and a second memory area; determining wear levels of each of the first memory area and the second memory area; and varying a ratio of the first memory area and the second memory area according to the determined wear levels.

In another embodiment of the present invention, there is provided an operating method of a data storage device including a nonvolatile memory device. The operating method includes the steps of: dividing a storage area of the nonvolatile memory device into a first memory area and a second memory area having a different program method from the first memory area; deciding an optimized lifetime ratio (ORL) based on a limit wear level and an average wear level of the first memory area, and a limit wear level and an average wear level of the second memory area; comparing the ORL to a reference value; and changing a part of the first memory area to the second memory area or changing a part of the second memory area to the first memory area, according to the result of the step of comparing the ORL to the reference value.

BRIEF DESCRIPTION OF THE DRAWINGS

Features, aspects, and embodiments are described in conjunction with the attached drawings, in which.

DETAILED DESCRIPTION

Hereinafter, an operating method of a data storage device according to the present invention will be described below with reference to the accompanying drawings through example embodiments.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
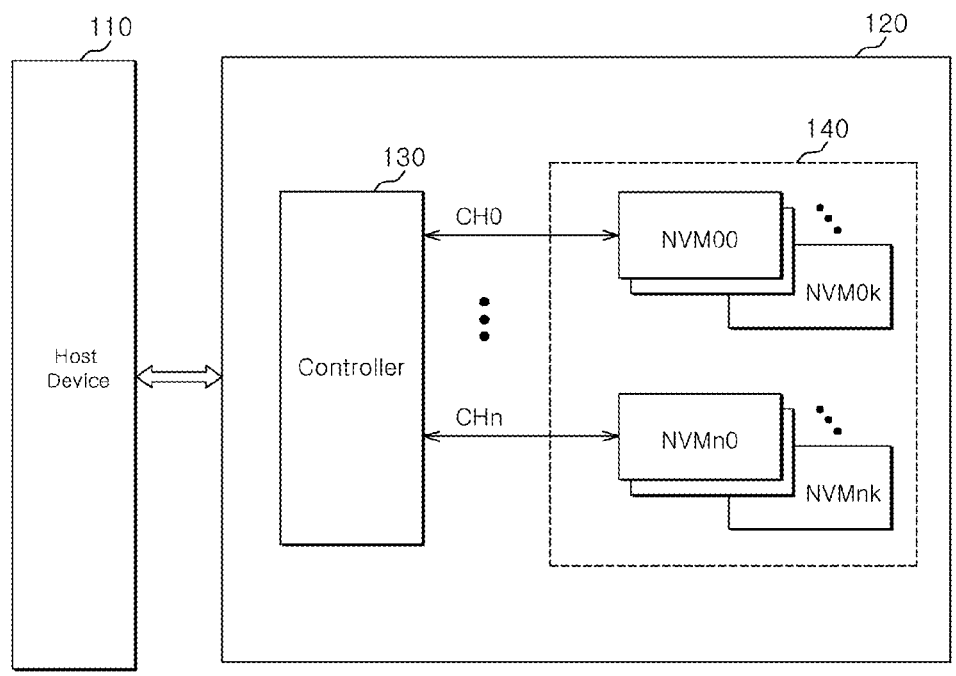
FIG. 1 is a block diagram of a data processing system including a data storage device according to one embodiment of the present invention.

FIG. 1 is a block diagram of a data processing system including a data storage device according to one embodiment of the present invention. Referring to FIG. 1, the data processing system 100 includes a host device 110 and a data storage device 120.

The host device 110 includes portable electronic devices such as mobile phones and MP3 players or electronic devices such as laptop computers, desktop computers, game machines, TVs, and beam projectors.

The data storage device 120 is configured to operate in response to a request of the host device 110. The data storage device 120 is configured to store data accessed by the host device 100. That is, the data storage device 120 may be used as a main memory device or secondary memory device of the host device 110. The data storage device 120 includes a controller 130 and a data storage medium 140. The controller 130 and the data storage medium 140 may be configured as a memory card connected to the host device 100 through various interfaces. Alternatively, the controller 130 and the data storage medium 140 may be configured as an SSD.

The controller 130 is configured to control the data storage medium 140 in response to a request from the host device 110. For example, the controller 130 is configured to provide data read from the data storage medium 140 to the host device 110. In another example, the controller 130 is configured to store data provided from the host device 110 in the data storage medium 140. For these operations, the controller 130 controls read, program (or write), and erase operations of the data storage medium 140.

The data storage medium 140 includes a plurality of nonvolatile memory devices NVM00 to NVM0$k$ and NVMn0 to NVMnk. According to an embodiment of the present invention, each of the nonvolatile memory devices NVM00 to NVM0$k$ and NVMn0 to NVMnk may be configured as a NAND flash memory device. However, each of the nonvolatile memory devices NVM00 to NVM0$k$ and NVMn0 to NVMnk may be configured as another kind of nonvolatile memory device instead of a NAND flash memory device. For example, each of the nonvolatile memory devices NVM00 to NVM0$k$ and NVMn0 to NVMnk may be configured as any one of various memory devices such as NOR flash memory, ferroelectric RAM (FRAM) using a ferroelectric capacitor, magnetic RAM (MRAM) using a tunneling magneto-resistive (TMR) layer, phase change memory (PRAM) using chalcogenide alloys, and resistive RAM (RERAM) using transition metal oxide.

Each of the flash memory devices NVM00 to NVM0$k$ and NVMn0 to NVMnk includes a plurality of memory cells. Each of the memory cells may store one-bit data or two or more-bit data. A memory cell capable of storing one-bit data is referred to as a single level cell (SLC). A memory device including the SLC is referred to as an SLC memory device. The SLC is programmed to have threshold voltages corresponding to one erase state and one program state. A memory cell capable of storing two or more-bit data is referred to as a multi-level cell (MLC). A memory device including the MLC is referred to as an MLC memory device. The MLC is programmed to have threshold voltages corresponding to one erase state and one of a plurality of program states.

Each of the flash memory devices NVM00 to NVM0$k$ and NVMn0 to NVMnk may be configured as an SLC memory device or MLC memory device. Alternatively, some of the flash memory devices NVM00 to NVM0$k$ and NVMn0 to NVMnk may be configured as SLC memory devices, and some of the flash memory devices NVM00 to NVM0$k$ and NVMn0 to NVMnk may be configured as MLC memory devices. Alternatively, each of flash memory devices NVM00 to NVM0$k$ and NVMn0 to NVMnk may be configured as a hybrid memory device. Here, the hybrid memory device indicates a memory device including a plurality of memory cells which are selectively used as SLCs or MLCs.

According to an embodiment of the present invention, the controller 130 may perform a buffer program operation to quickly respond to a request of the host device 110. Such a buffer program operation will be described in detail with reference to FIG. 2.

Figure 2:
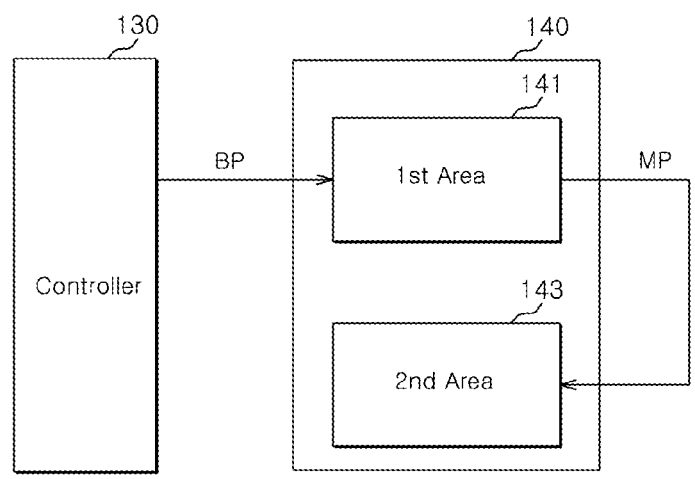
FIG. 2 is a diagram for describing a buffer program operation according to an embodiment of the present invention.

FIG. 2 is a diagram for describing the buffer program operation according to an embodiment of the present invention.

Referring to FIG. 2, the storage medium 140 may be divided into a first area 141 and a second area 143. The first area 141 and the second area 143 may be logically varied according to control of the controller 130 (for example, address mapping). The first area 141 is a hidden area to which a user cannot have access, and the second area 143 is a user area to which a user may have an access.

The first area 141 may include a plurality of memory cells, and the number of bits stored in each of the memory cells belonging to the first area 141 may be set to be less than the number of bits stored in each of memory cells belonging to the second area 143. For example, each of the memory cells belonging to the first area 141 may store two-bit data, and each of the memory cells belonging to the second area 143 may store four-bit data. For another example, each of the memory cells belonging to the first area 141 may store one-bit data, and each of the memory cells belonging to the second area 143 may store two-bit data.

Since the number of bits stored in each cell of the first area 141 is different from the number of bits stored in each cell of the second area 143, the memory cells belonging to the first area 141 area accessed in a different manner from the memory cells belonging to the second area 143. For example, suppose that the memory cells belonging to the first area 141 store one-bit data and the memory cells belonging to the second area 143 store two-bit data. In this case, the memory cells belonging to the first area 141 may be programmed in the SLC manner, and the memory cells belonging to the second area 143 may be programmed in the MLC manner. Furthermore, the memory cells belonging to the first area 141 may be read in the SLC manner, and the memory cells belonging to the second area 143 may be read in the MLC manner.

Since the number of bits stored in each cell of the first area 141 is lower than the number of bits stored in each cell of the second area 143, the memory cells belonging to the first area 141 may be programmed at a higher speed than the memory cells belonging to the second area 143. Therefore, the controller 130 preferentially programs write data provided from the host device 110 of FIG. 1 into the first area 141. This operation is defined as buffer programming (BP). The controller 130 transmits a response to the write request to the host device 110, and then programs the data stored in the first area 141 into the second area 143. This operation is defined as main programming (MP). According to the buffer programming operation, since the data storage device 120 of FIG. 1 may quickly respond to the write request of the host device 110, the processing speed of the data storage device 120 may increase.

Figure 3:
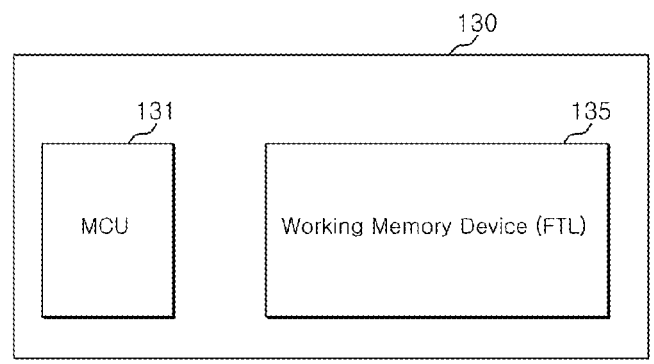
FIG. 3 is a block diagram illustrating a controller of the data storage device of FIG. 1.

FIG. 3 is a block diagram illustrating the controller of the data storage device of FIG. 1. Referring to FIG. 3, the controller 130 includes a micro controller unit (MCU) 131 and a working memory device 135. However, components of the controller 130 are not limited to the above-described components. For example, the controller 130 may further include a host interface, a memory interface, an error correction code (ECC) unit and the like.

The MCU 131 is configured to control overall operations of the controller 130. The MCU 131 is configured to drive firmware for controlling the overall operations of the controller 130. The firmware is loaded into the working memory device 135 and then driven. The MCU 131 may provide a command, an address, a control signal, and data for controlling the data storage medium 140 according to a request of the host device 110 of FIG. 1.

The working memory device 135 is configured to store firmware and data for controlling the controller 130. The working memory device 135 may include one or more of a cache, DRAM, SRAM, ROM, NOR flash memory devices and the like. According to an embodiment of the present invention, the working memory device 135 stores a flash translation layer (FTL). When a request is made from the host device 110, the FTL is driven by the MCU 131.

Figure 4:
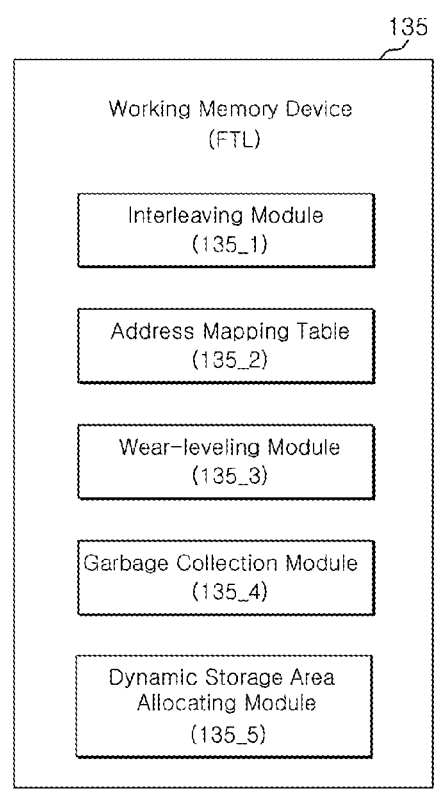
FIG. 4 is a diagram explaining firmware driven in a working memory device of FIG. 3.

FIG. 4 is a diagram explaining firmware driven in the working memory device of FIG. 3.

Each of the flash memory devices forming the data storage medium 140 of FIG. 1 performs a read or program operation on a page-wise basis, due to structural characteristics thereof. Furthermore, the flash memory device performs an erase operation on a block-wise basis, due to the structure characteristics thereof. Here, a page means an operating unit including a plurality of memory cells, and a block means an operating unit including a plurality of pages. Furthermore, the flash memory device cannot perform an over-write operation. That is, a flash memory cell having data stored therein must be erased to store new data.

Because of such characteristics of the flash memory device, the data storage device 120 including the flash memory devices serving as the data storage medium 140 requires additional software called disk emulation software to guarantee compatibility with the host device 100 of FIG. 1. That is, the data storage device 120 including the flash memory devices operates firmware such as the FTL to guarantee compatibility with the host device 100.

The FTL manages read, program, and erase operations of the flash memory devices such that the data storage device 120 may be operated in response to an access required from a file system of the host device 110 (for example, read/write operation). Accordingly, the file system of the host device 110 may recognize the data storage device 120 including the flash memory devices as a general data storage device.

Referring to FIG. 4, the FTL includes a plurality of modules and management data. For example, the FTL may include an interleaving module 135_1, an address mapping table 135_2, a wear-leveling module 135_3, a garbage collection module 135_4, and a dynamic storage area allocating module 135_5. However, the components of the FTL are not limited to the above-described modules. For example, the FTL may further include a bad block management module for managing a block containing a failed memory cell and a sudden power-off management module for preparing for unexpected power-off.

The interleaving module 135_1 performs an interleaving operation (or deinterleaving operation) between the flash memory devices forming the data storage medium 140. The interleaving module 135_1 manages data to be programmed in the data storage medium 140 according to the interleaving method. For example, the interleaving module 135_1 may divide data to be stored in the data storage medium 140 into arbitrary sizes, mix the divided data, and reconstruct the mixed data into data to be actually programmed. Furthermore, the interleaving module 135_1 may program the reconstructed data into the flash memory devices of the data storage medium 140 in parallel. Furthermore, the interleaving module 135_1 manages data stored in the data storage medium 140 such that the data may be read out according to the deinterleaving method. The deinterleaving method may be performed in the opposite order of the interleaving method.

When the host device 110 accesses the data storage device 120, for example, when the host device 110 requests a read or write operation, the host device 110 provides a logical address to the data storage device 120. The FTL translates the provided logical address into a physical address of the data storage medium 140, and performs the requested operation by referring to the translated physical address. The FTL manages address translation data, that is, the address mapping table 135_2, in order to perform the address translation operation.

The ware-leveling module 135_3 manages the wear levels of blocks of the flash memory devices forming the data storage medium 140. The memory cells of the flash memory devices are aged by program and erase operations. Aged memory cells, that is, worn memory cells may develop a defect, for example, a physical defect. The wear-leveling module 135_3 levels off the erase-write counts of the respective blocks, in order to prevent a specific block of the flash memory devices from being worn more rapidly than the other blocks.

In this embodiment of the present invention, the wear-leveling module 135_3 may manage wear levels of the first area 141 and the second area 143 of FIG. 2. For example, the wear-leveling module 135_3 may manage an average wear level of the first area 141. Furthermore, the wear-leveling module 135_3 may manage the wear level of each memory block belonging to the first area 141. The wear-leveling module 135_3 may manage an average wear level of the second area 143. Furthermore, the wear-leveling module 135_3 may manage the wear level of each memory block belonging to the second area 143.

The garbage collection module 135_4 manages blocks in which fragmented data are stored. The flash memory devices forming the data storage medium 140 cannot perform an over-write operation, and the program unit thereof is greater than the erase unit. For this reason, the flash memory devices require an operation of collecting effective data distributed at physically different positions into the same address area using an arbitrary empty space, when the storage space thereof approaches a predetermined limit. The garbage collection module 135_4 performs a plurality of write operations and a plurality of erase operations to collect fragmented data into the same address area.

The dynamic storage area allocating module 135_5 dynamically allocates the data storage medium 140, that is, the first area 141 and the second area 143 of the storage area. The dynamic storage area allocating module 135_5 may refer to the address mapping table 135_2 and the wear levels managed by the wear-leveling module 135_3, in order to perform the dynamic allocating operation. The dynamic storage area allocating method will be described below in detail.

Figures 5, 6:
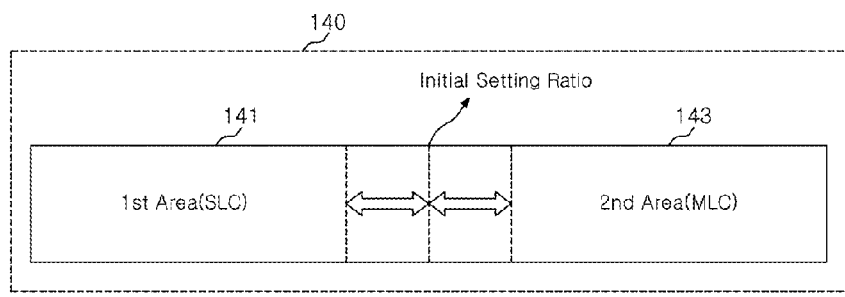
FIG. 5 is a conceptual diagram for explaining a dynamic storage area allocating method according to an embodiment of the present invention.
FIG. 6 is a table showing a condition for applying the dynamic storage area allocating method according to an embodiment of the present invention.

FIG. 5 is a conceptual diagram for explaining the dynamic storage area allocating method according to an embodiment of the present invention. For convenience of description, suppose that the first area 141 is an SLC area capable of storing one-bit data per cell, and the second area 143 is an MLC area capable of storing two or more-bit data per cell. However, the first and second areas 141 and 143 are not limited to this supposition. For example, the number of bits stored per cell in the first area 141 may be set to be less than the number of bits stored per cell in the second area 143, and the first area 141 may include memory cells having a higher program speed and a longer lifetime (for example, a higher erase-write count before the memory cell fails) than the second area 143.

As described above, the controller 130 divides the data storage medium 140, that is, the storage area into the SLC area 141 and the MLC area 143, in order to perform the buffer program operation. When the SLC area 141 for buffer programming increases, the data storage device 120 may more quickly respond to a write request of the host device 100 of FIG. 1. When the MLC area 143 for main programming increases, the storage capacity of the data storage device 120, which is provided to a user, may increase. Therefore, the data storage medium 140 may be divided into the SLC area 141 and the MLC area 143 according to an initial setting ratio considering the correlation.

According to an embodiment of the present invention, the SLC area 141 and the MLC area 143 may be dynamically allocated according to wear levels of the respective areas 141 and 143. Hereafter, such a method is defined as a dynamic storage area allocating method. According to the dynamic storage area allocating method, the ratio of the SLC area 141 to the MLC area 143 changes according to the wear levels of the respective areas 141 and 143. That is, the sizes of the SLC area 141 and the MLC area 143 dynamically change depending on the wear levels of the respective areas 141 and 143. For example, the SLC area 141 may increase. When the SLC area 141 increases, the MLC area 143 may proportionally decrease. For another example, the wear level of the SLC area 141 may decrease depending on the wear level. When the SLC area 141 decreases, the MLC area 143 may proportionally to increase.

FIG. 6 is a table showing a condition for applying the dynamic storage area allocating method according to an embodiment of the present invention. FIG. 6 shows a method for dynamically allocating the storage area based on an optimized lifetime ratio (OLR). In FIG. 6, suppose that the first area is an SLC area and the second area is an MLC area, as illustrated in FIG. 5. However, the number of bits stored in each cell belonging to the first area may be set to be less than the number of bits stored in each cell belonging to the second area, and the first area may include memory cells having a higher program speed and a longer lifetime (for example, a higher erase-write count before the memory cell fails) than the memory cells of the second area.

The OLR is calculated according to the lifetime Ls of the SLC area, the lifetime Lm of the MLC area, an average erase-write count Ms of the SLC area, and an average erase-write count Mm of the MLC area. The lifetime used for calculating the OLR indicates a limit erase-write count of each area, that is the lifetime, or limit wear level, of an area may be defined based on a number of erase-writes that may occur in that area before the lifetime or limit wear level for that area is reached. The OLR is an index for indicating how much the SLC area was used (or worn) with respect to the lifetime of the SLC area. Furthermore, the OLR is an index for indicating how much the MLC area was used (or worn) with respect to the lifetime of the MLC area.

When the OLR is less than 1, it means that the average erase-write count Mm of the MLC area is high. When the OLR is less than 1, it means that the average erase-write count Mm of the MLC area is approaching its lifetime. Therefore, when the dynamic storage area allocating area is applied according to the OLR, the MLC area increases. This may be accomplished by reducing the SLC area, as described with reference to FIG. 5.

When the OLR is 1, it means that the average erase-write count Ms of the SLC area and the average erase-write count Mm of the MLC area are normal. That is, when the OLR is 1, it means that the SLC area and the MLC area are equally used with respect to the lifetimes of the respective areas, and thus the SLC area and MLC area may have an average wear level. Therefore, the dynamic storage area allocating method may not be applied according to the OLR.

When the OLR is greater than 1, it means that the average erase-write count Ms of the SLC area is high. That is, when the OLR is greater than 1, it means that the average erase-write count Ms of the SLC area is approaching the lifetime. Therefore, when the dynamic storage area allocating method is applied according to the OLR, the SLC area increases. This may be accomplished by reducing the MLC area as described with reference to FIG. 5.

Meanwhile, whether the average erase-write counts of the SLC area and the MLC area are approaching the respective lifetimes or not may be determined in various manners. For example, when each of the average erase-write counts corresponds to a half of the lifetime, it may be determined that the average erase-write count is approaching the defined lifetime of an area. For another example, when each of the average erase-write counts corresponds to ⅔ of the lifetime, it may be determined that the average erase-write count is approaching the defined lifetime of an area.

Figure 7:
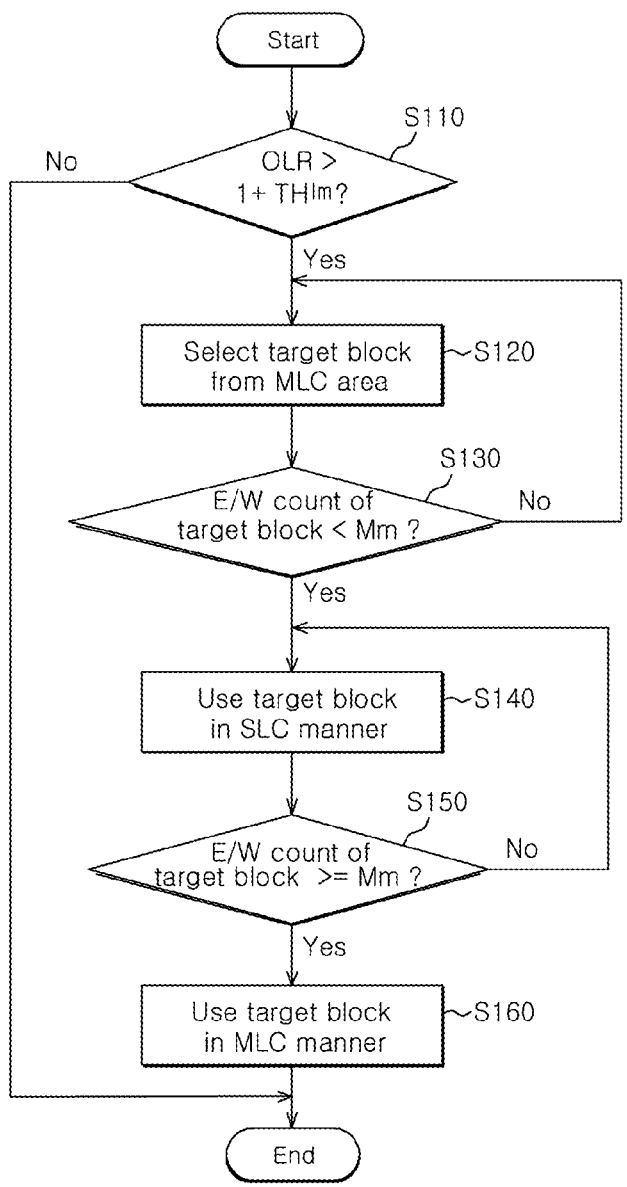
FIG. 7 is a flow chart showing the dynamic storage area allocating method according to an embodiment of the present invention.

FIG. 7 is a flow chart showing the dynamic storage area allocating method according to an embodiment of the present invention. FIG. 7 shows a dynamic storage area allocating method which is applied when the OLR is greater than 1, that is, when the average erase-write count Ms of the SLC area approaches its lifetime. In FIG. 7, suppose that the first area is an SLC area and the second area is an MLC area, as described above. However, the number of bits stored in each cell belonging to the first area may be set to be less than the number of bits stored in each cell belonging to the second area, and the first area may include memory cells having a higher program speed and a longer lifetime (for example, a higher erase-write count) than the memory cells of the second area.

At step S110, whether the OLR is greater than 1 or not is determined. When it is determined that the OLR is not greater than 1, the dynamic storage area allocating method is not be applied. However, when it is determined that the OLR is greater than 1, the procedure for the dynamic storage area allocating method proceeds to step S120.

For example, when determining whether the OLR is greater than 1 or not, a lifetime ratio maintenance threshold value THlm may be considered. The lifetime ratio maintenance threshold value THlm may be set by considering the lifetimes of the SLC area and the MLC area. Furthermore, the lifetime ratio maintenance threshold value THlm may be set by considering the initial setting ratio (refer to FIG. 5) based on the use of the SLC area and the MLC area. Furthermore, the lifetime ratio maintenance threshold value THlm may be set by considering degradation characteristics of the memory cells belonging to the SLC area and the MLC area.

When the OLR is determined by considering the lifetime ratio maintenance threshold value THlm, the SLC area and the MLC area are set to a proper ratio. For example, suppose that the lifetime ratio maintenance threshold value THlm is 0.2. When the lifetime ratio maintenance threshold value THlm is considered, whether the OLR is greater than 1.2 or not is determined. In this case, a time point when the dynamic storage area allocating method is applied may be delayed, compared to when determining whether the OLR is greater than 1 or not. This means that the time point at which the dynamic storage area allocating method is applied may be controlled to adjust the ratio of the SLC area to the MLC area.

At step S120, a target block which is to be allocated to the SLC area is selected from memory blocks belonging to the MLC area. At this time, an erase-write count of the target block is considered.

That is, at step S130, whether or not the erase-write count of the target block is less than the average erase-write count Mm of the MLC area is determined. When the erase-write count of the target block is greater than the average erase-write count Mm of the MLC area, the procedure returns to step S120 to select another target block. That is, a block having a low erase-write count among the memory blocks belonging to the MLC may be selected by considering that the block is to be included in the SLC area and the erase-write count thereof is to increase. On the other hand, when the erase-write count of the target block is less than the average erase-write count Mm of the MLC area, the procedure proceeds to step S140.

At step S140, the target block is used in the SLC manner. This means that the target block is included in the SLC area. That is, the SLC area is increased by the target block.

At step S150, whether or not the erase-write count of the target block is equal to or greater than the average erase-write count Mm of the MLC area is determined. The determination operation may be performed when an erase operation for the target block is performed to update the erase-write count of the target block. When the erase-write count of the target block is less than the average erase-write count Mm of the MLC area, the target block is continues to be used in the SLC manner. On the other hand, when the erase-write count of the target block is equal to or greater than the average erase-write count Mm of the MLC area, the procedure proceeds to step S160.

Step S150 is performed when the condition of step S110 is satisfied, that is, when the OLR is greater than (1+lifetime ratio maintenance threshold value THlm). If when the OLR is equal to or less than (1+lifetime ratio maintenance threshold value THlm), the procedure proceeds past step S160, without step S150.

At step S160, the target block is used in the MLC manner. That is, when the erase-write count of the target block is equal to or greater than the average erase-write count Mm of the MLC area, the target block may be included in the previous area, before the erase-write count thereof approaches the lifetime.

Figure 8:
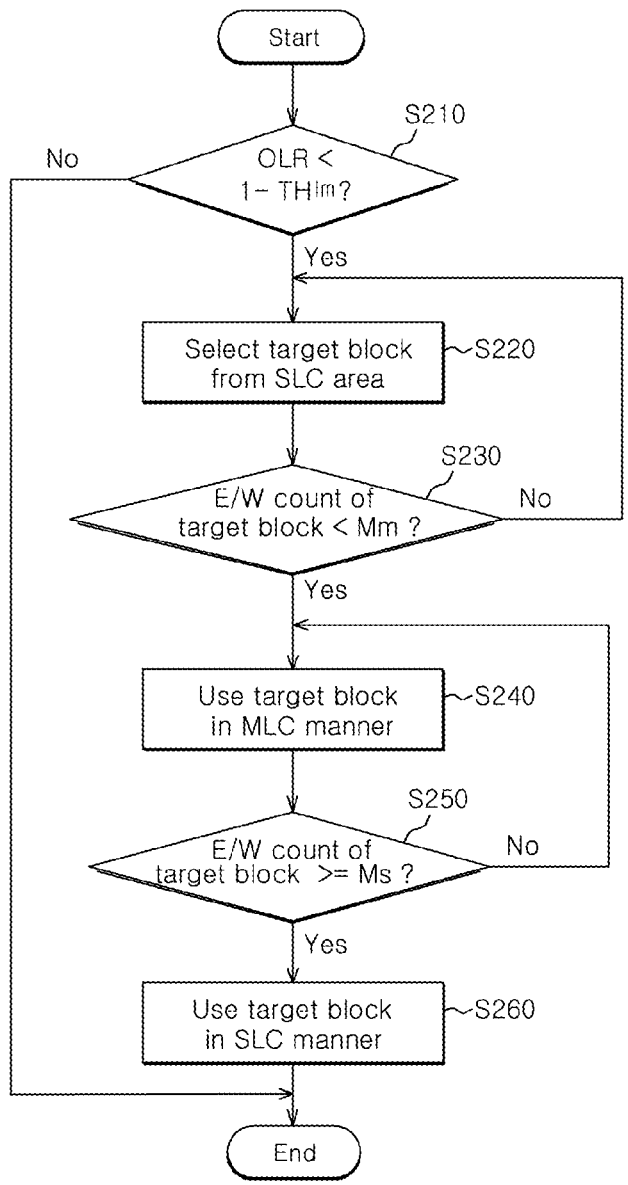
FIG. 8 is another flow chart showing the dynamic storage area allocating method according to an embodiment of the present invention.

FIG. 8 is another flow chart showing the dynamic storage area allocating method according to an embodiment of the present invention. FIG. 8 shows a dynamic storage area allocating method which is applied when the OLR is less than 1, that is, when the average erase-write count Mm of the MLC area approaches a lifetime. In FIG. 8, suppose that the first area is the SLC area and the second area is the MLC area, as described above. However, the number of bits stored in each cell belonging to the first area may be set to be less than the number of bits stored in each cell belonging to the second area, and the first area may include memory cells having a higher program speed and a longer lifetime (for example, a higher erase-write count) than the memory cells of the second area.

At step S210, whether or not the OLR is less than 1 is determined. When it is determined that the OLR is greater than 1, the dynamic storage area allocating method is not be applied. However, when it is determined that the OLR is less than 1, the procedure for the dynamic storage area allocating method proceeds to step S220.

For example, when determining whether the OLR is less than 1 or not, a lifetime ratio maintenance threshold value THlm may be considered. The lifetime ratio maintenance threshold value THlm may be set by considering the lifetimes of the SLC area and the MLC area. Furthermore, the lifetime ratio maintenance threshold value THlm may be set by considering the initial setting ratio (refer to FIG. 5) based on the use of the SLC area and the MLC area. Furthermore, the lifetime ratio maintenance threshold value THlm may be set by considering degradation characteristics of the memory cells belonging to the SLC area and the MLC area.

When the OLR is determined by considering the lifetime ratio maintenance threshold value THlm, the SLC area and the MLC area are set to a proper ratio. For example, suppose that the lifetime ratio maintenance threshold value THlm is 0.2. When the lifetime ratio maintenance threshold value THlm is considered, whether or not the OLR is greater than 0.8 is determined. In this case, a time point when the dynamic storage area allocating method is applied may be delayed, compared to when determining whether the OLR is greater than 1 or not. This means that the time point when the dynamic storage area allocating method is applied may be controlled to adjust the ratio of the SLC area to the MLC area.

At step S220, a target block which is to be allocated to the MLC area is selected from memory blocks belonging to the SLC area. At this time, an erase-write count of the target block is considered.

That is, at step S230, whether or not the erase-write count of the target block is less than the average erase-write count Mm of the MLC area is determined. When the erase-write count of the target block is greater than the average erase-write count Mm of the MLC area, the procedure returns to step S220 to select another target block. That is, since a memory block having a greater erase-write count than the average erase-write count Mm of the MLC area may increase the average erase-write number Mm of the MLC area, a block having a lower erase-write count than the average erase-write count Mm of the MLC area may be selected from the memory blocks belonging to the SLC area. On the other hand, when the erase-write number of the target block is less than the average erase-write number Mm of the MLC area, the procedure proceeds to step S240.

At step S240, the target block is used in the MLC manner. This means that the target block is included in the MLC area. That is, the MLC area is increased by the target block.

At step S250, whether or not the erase-write count of the target block is equal to or greater than the average erase-write count Ms of the SLC area is determined. The determination operation may be performed when an erase operation for the target block is performed to update the erase-write count of the target block. When the erase-write count of the target block is less than the average erase-write count Ms of the SLC area, the target block continues to be used in the MLC manner. On the other hand, when the erase-write count of the target block is equal to or greater than the average erase-write count Ms of the SLC area, the procedure proceeds to step to S260.

Step S250 is performed when the condition of step S210 is satisfied, that is, when the OLR is less than (1−lifetime ratio maintenance threshold value THlm). If when the OLR is equal to or greater than (1−lifetime ratio maintenance threshold value THlm), the procedure proceeds past step S260, without performing step S250.

At step S260, the target block is used in the SLC manner. That is, when the erase-write count of the target block is equal to or greater than the average erase-write count Ms of the SLC area, the target block may be included in the previous area, before the erase-write count thereof approaches the lifetime.

Figure 9:
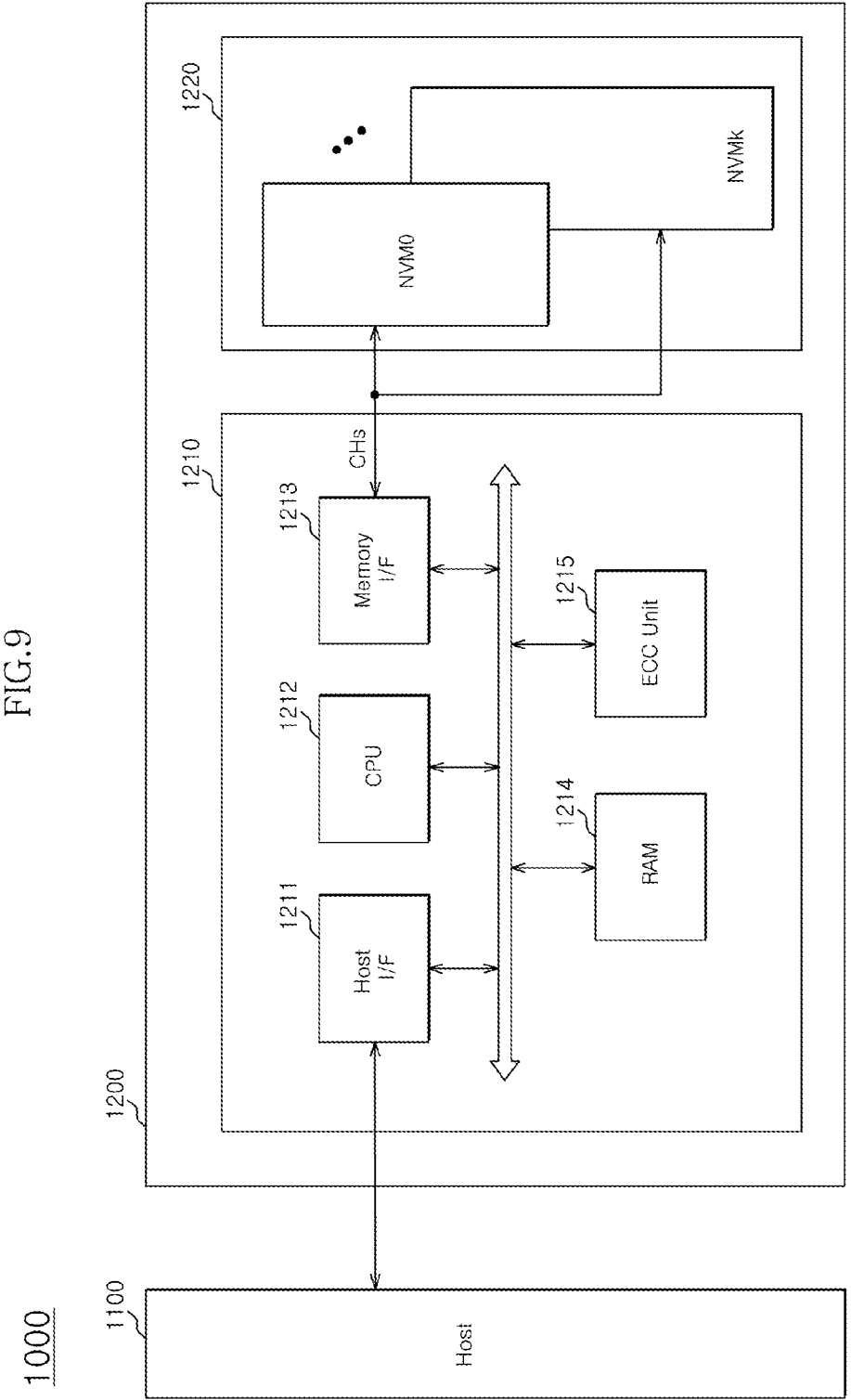
FIG. 9 is a block diagram illustrating a data processing system according to another embodiment of the present invention.

FIG. 9 is a block diagram illustrating a data processing system according to another embodiment of the present invention. Referring to FIG. 9, the data processing system 1000 includes a host device 1100 and a data storage device 1200. The data storage device 1200 includes a controller 1210 and a data storage medium 1220. The data storage device 1200 may be connected to the host device 1100 such as a desktop computer, a notebook computer, a digital camera, a mobile phone, an MP3 player, or a game machine. The data storage device 1200 may also be called a memory system.

The data storage device 1200 may perform the dynamic storage area allocating method according to an embodiment of the present invention. Therefore, the lifetime of the data storage device 1200 may be extended, and the reliability of the data storage device 1200 may be improved.

The controller 1210 is connected to the host device 1100 and the data storage medium 1220. The controller 1210 is configured to access the data storage medium 1220 in response to a request from the host device 1100. For example, the controller 1210 may be configured to control a read, program, or erase operation of the data storage medium 1220. The controller 1210 is configured to drive firmware for controlling the data storage medium 1220.

The controller 1210 may include well-known components such as a host interface 1211, a CPU 1212, a memory interface 1213, a RAM 1214, and an ECC unit 1215.

The CPU 1212 is configured to control overall operations of the controller 1210 in response to a request of the host device 1100. The RAM 1214 may be used as a working memory of the CPU 1212. The RAM 1214 may temporarily store data read from the data storage medium 1220 or data provided from the host device 1100.

The host interface 1211 is configured to act as an interface to the host device 1100 and the controller 1210. For example, the host interface 1211 may be configured to communicate with the host device 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, a SCSI (Small Computer System Interface) protocol, a SAS (Serial SCSI) protocol, and an IDE (Integrated Drive Electronics) to protocol.

The memory interface 1213 is configured to act as an interface to the controller 1210 and the data storage medium 1220. The memory interface 1213 is configured to provide a command and an address to the data storage medium 1220. Furthermore, the memory interface 1213 is configured to exchange data with the data storage medium 1220.

The ECC unit 1215 is configured to detect an error of the data read from the data storage medium 1220. Furthermore, the ECC unit 1215 is configured to correct the detected error, when the detected error falls within a correction range. Meanwhile, the ECC unit 1215 may be provided inside or outside the controller 1210 depending on the memory system 1000.

The controller 1210 and the data storage medium 1220 may be configured as a solid state drive (SSD).

In another example, the controller 1210 and the data storage medium 1220 may be integrated into one semiconductor device to form a memory card. For example, the controller 1210 and the data storage medium 1220 may be integrated into one semiconductor device to form a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted as various types of packages. For example, the controller 1210 or the data storage medium 1220 may be packaged and mounted according to various methods such as POP (package on package), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 10:
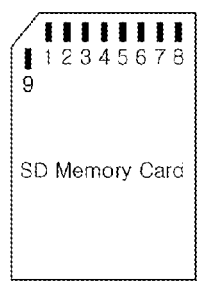
FIG. 10 illustrates a memory card including a memory device according to an embodiment of the present invention.

FIG. 10 illustrates a memory card including the memory device according to an embodiment of the present invention. FIG. 10 illustrates the exterior of an SD (secure digital) card among memory cards.

Referring to FIG. 10, the SD card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transferred. In general, the command is transmitted to the SD card from the host device, and the response signal is transmitted to the host device from the SD card.

The data pins (first, seventh, eighth, and ninth pins) are divided into receive (Rx) pins for receiving data transmitted from the host device and transmit (Tx) pins for transmitting data to the host device. The Rx pins and the Tx pins, respectively, form a pair to transmit differential signals.

The SD card may perform the dynamic interleaving method according to an embodiment of the present invention. Therefore, the lifetime of the SD card may be extended, and the reliability thereof may be improved.

Figure 11:
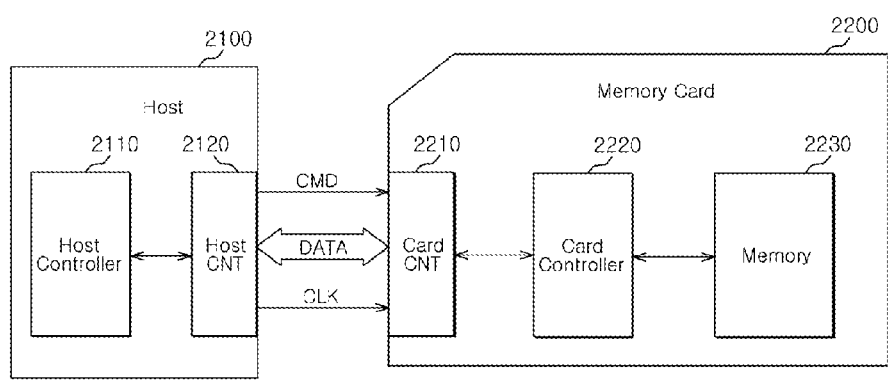
FIG. 11 is a block diagram illustrating an internal configuration of the memory card illustrated in FIG. 10 and a connection relation between the memory card and a host device.

FIG. 11 is a block diagram illustrating an internal configuration of the memory card illustrated in FIG. 10 and the connection relation between the memory card and a host device. Referring to FIG. 11, the data processing system 2000 includes a host device 2100 and a memory card 2200. The host device 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may differ depending on the type of the memory card 2200.

The host device 2100 stores data in the memory card 2200 or reads data stored in the memory card 2200.

The host controller 2110 transmits a write command CMD, a clock signal CLK generated from a clock generator (not illustrated) inside the host device 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 12:
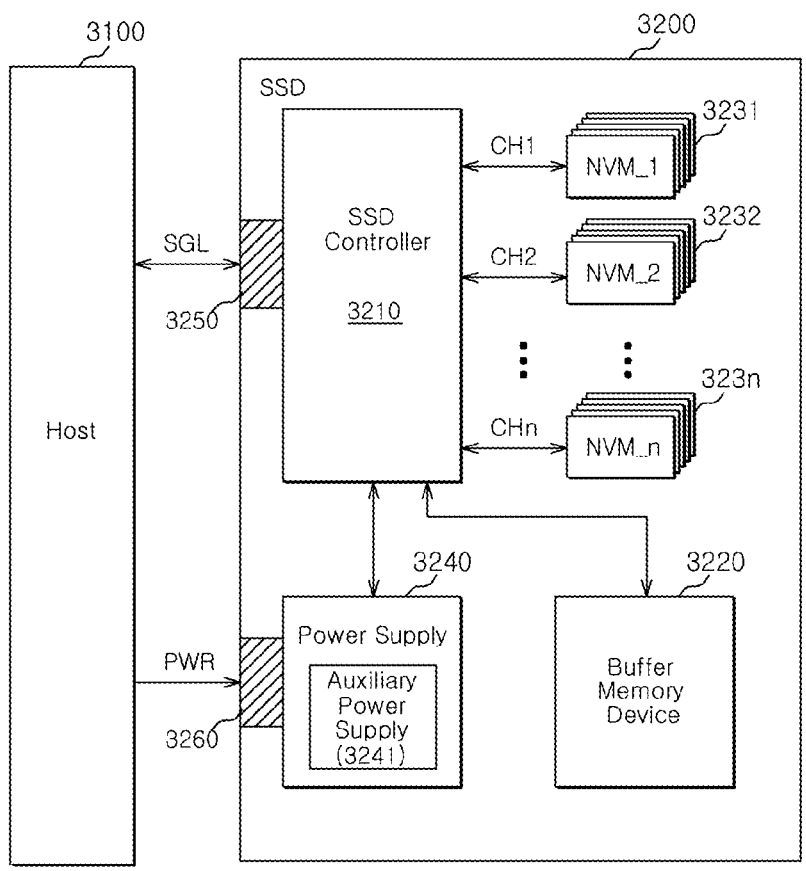
FIG. 12 is a block diagram illustrating an SSD according to an embodiment of the present invention.

FIG. 12 is a block diagram illustrating an SSD according to an embodiment of the present invention. Referring to FIG. 12, a data processing system 3000 includes a host device 3100 and an SSD 3200.

The SSD 3200 includes an SSD controller 3210, a buffer memory device 3220, a plurality of nonvolatile memory devices 3231 to 323*n*, a power supply 3240, a signal connector 3250, and a power connector 3260.

The SSD 3200 operates in response to a request of the host device 3100. That is, the SSD controller 3210 is configured to access the nonvolatile memory devices 3231 to 323*n* in response to a request from the host 3100. For example, the SSD controller 3210 is configured to control read, program, and erase operations of the nonvolatile memory devices 3231 to 323*n*. Furthermore, the SSD controller 3210 may perform the dynamic storage area allocating method according to an embodiment of the present invention. Therefore, the lifetime of the SSD 3200 may be extended, and the reliability of the SSD 3200 may be improved.

The buffer memory device 3220 is configured to temporarily store data which are to be stored in the nonvolatile memory devices 3231 to 323*n*. Furthermore, the buffer memory device 3220 is configured to temporarily store data read from the nonvolatile memory devices 3231 to 323*n*. The data which is temporarily stored in the buffer memory device 3220 is transmitted to the host device 3100 or the nonvolatile memory devices 3231 to 323*n*, according to the control of the SSD controller 3210.

The nonvolatile memory devices 3231 to 323*n* are used as storage media of the SSD 3200. The respective nonvolatile memory devices 3231 to 323*n* are connected to the SSD controller 3210 through a plurality of channels CH1 to CHn. One channel may be connected to one or more nonvolatile memory devices. The nonvolatile memory devices connected to one channel may be connected to the same signal bus and the same data bus.

The power supply 3240 is configured to provide power PWR inputted through the power connector 3260 into the SSD 3200. The power supply 3240 includes an auxiliary power supply 3241. The auxiliary power supply 3241 is configured to supply power to normally terminate the SSD 3200, when sudden power loss occurs. The auxiliary power supply 3241 may include super capacitors capable of storing power PWR.

The SSD controller 3210 is configured to exchange signals SGL with the host device 3100 through the signal connector 3250. Here, the signals SGL may include commands, addresses, data and the like. The signal connector 3250 may be configured as a connector such as PATA (Parallel Advanced Technology Attachment), SATA (Serial Advanced Technology Attachment), SCSI (Small Computer System Interface), or SAS (Serial SCSI), according to the interface method between the host device 3100 and the SSD 3200.

Figure 13:
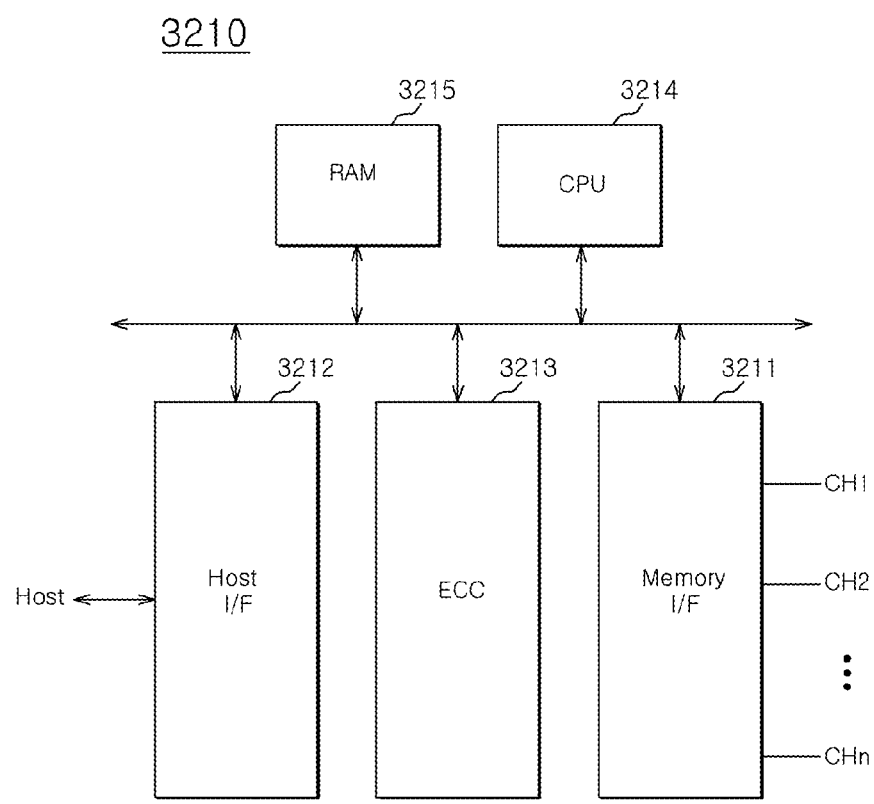
FIG. 13 is a block diagram illustrating the SSD controller illustrated in FIG. 12.

FIG. 13 is a block diagram illustrating the SSD controller illustrated in FIG. 12. Referring to FIG. 13, the SSD controller 3210 includes a memory interface 3211, a host interface 3212, an ECC unit 3213, a CPU 3214, and a RAM 3215.

The memory interface 3211 is configured to provide a command and an address to the nonvolatile memory devices 3231 to 323*n*. Furthermore, the memory interface 3211 is configured to exchange data with the nonvolatile memory devices 3231 to 323*n*. The memory interface 3211 may scatter data transferred from the buffer memory device 3220 over the respective channels CH1 to CHn, according to the control of the CPU 3214. Furthermore, the memory interface 3211 transfers data read from the nonvolatile memory devices 3231 to 323*n* to the buffer memory device 3220, according to the control of the CPU 3214.

The host interface 3212 is configured to provide an interface with the SSD 3200 in response to the protocol of the host device 3100. For example, the host interface 3212 may be configured to communicate with the host 3100 through one of PATA (Parallel Advanced Technology Attachment), SATA (Serial Advanced Technology Attachment), SCSI (Small Computer Small Interface), and SAS (Serial SCSI) protocols. Furthermore, the host interface 3212 may perform a disk emulation function of supporting the host device 3100 to recognize the SSD 3200 as a hard disk drive (HDD).

The ECC unit 3213 is configured to generate parity bits based on the data transmitted to the nonvolatile memory devices 3231 to 323*n*. The generated parity bits may be stored in spare areas of the nonvolatile memory devices 3231 to 323*n*. The ECC unit 3213 is configured to detect an error of data read from the nonvolatile memory devices 3231 to 323*n*. When the detected error falls within a correction range, the ECC unit 3213 may correct the detected error.

The CPU 3214 is configured to analyze and process a signal SGL inputted from the host device 3100. The CPU 3214 controls overall operations of the SSD controller 3210 in response to a request of the host device 3100. The CPU 3214 controls the operations of the buffer memory device 3220 and the nonvolatile memory devices 3231 to 323*n* according to firmware for driving the SSD 3200. The RAM 3215 is used as a working memory device for driving the firmware.

Figure 14:
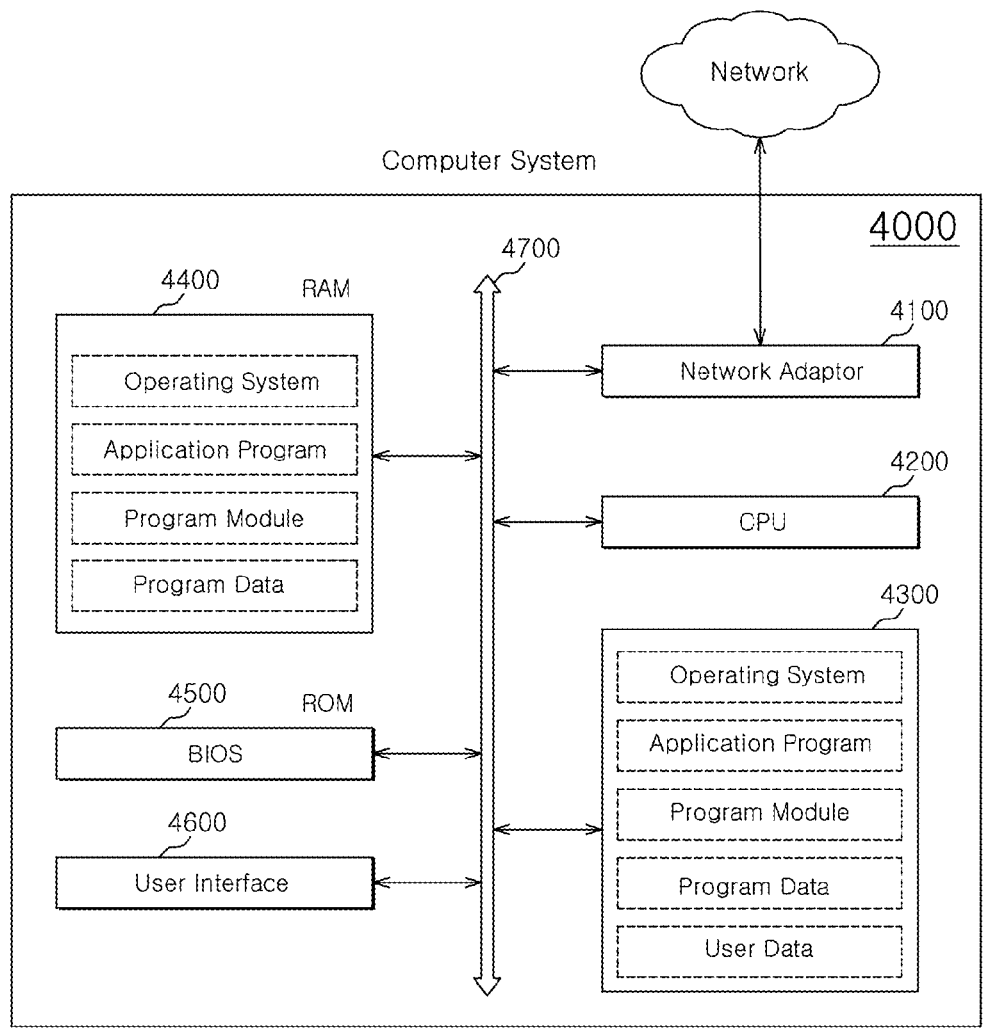
FIG. 14 is a block diagram illustrating a computer system in which the data storage device according to an embodiment of the present invention is mounted.

FIG. 14 is a block diagram illustrating a computer system in which the data storage device according to an embodiment of the present invention may be mounted. Referring to FIG. 14, the computer system 4000 includes a network adapter 4100, a CPU 4200, a data storage device 4300, a RAM 4400, a ROM 4500, and a user interface 4600, which are electrically connected to the system bus 4700. Here, the data storage device 4300 may be configured as the data storage device 120 illustrated in FIG. 1, the data storage device 1200 illustrated in FIG. 9, or the SSD 3200 illustrated in FIG. 11.

The network adapter 4100 is configured to interface the computer system 400 and external networks. The CPU 4200 is configured to perform overall arithmetic operations for driving an operating system or application programs staying in the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During a booting operation, the operating system, application programs, and various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 400 may further include a battery, an application chipset, a camera image processor (CIS) and the like.

While certain embodiments have been described above, it will be understood to those skilled in the art that the embodiments described are by way of example only. Accordingly, the operating method described herein should not be limited based on the described embodiments. Rather, the operating method described herein should only be limited in light of the claims that follow when taken in conjunction with the above description and accompanying drawings.

What is claimed is:

1. An operating method of a data storage device including a plurality of nonvolatile memory devices, the operating method comprising the steps of:
dividing storage areas of the nonvolatile memory devices into a first memory area and a second memory area;
determining wear levels of each of the first memory area and the second memory area; and
varying a ratio of the first memory area and the second memory area according to the determined wear levels.

2. The operating method according to claim 1, wherein the step of varying the ratio of the first memory area and the second memory area comprises the step of increasing the first memory area when it is determined that the wear level of the first memory area approaches a limit wear level of the first memory area.

3. The operating method according to claim 1, wherein the step of varying the ratio of the first memory area and the second memory area comprises the step of increasing the second memory area when it is determined that the wear level of the second memory area approaches a limit wear level of the second memory area.

4. The operating method according to claim 1, wherein the step of dividing the storage areas comprises the step of dividing the storage area of each of the nonvolatile memory devices into the first memory area and the second memory area.

5. The operating method according to claim 4, wherein first memory area and the second memory area are controlled through different program methods.

6. The operating method according to claim 1, wherein the number of bits stored in each of memory cells belonging to the first memory area is less than the number of bits stored in each of memory cells belonging to the second memory area, or the memory cell of the first memory area has a higher program speed or a higher limit wear level than the memory cell of the second memory area.

7. The operating method according to claim 1, wherein the step of determining the wear levels of each of the first memory area and the second memory area comprises the step of comparing a reference value to an optimized lifetime ratio (OLR) which is decided based on the limit wear levels and the average wear levels of each of the first memory area and the second memory area.

8. The operating method according to claim 1, wherein the first memory area comprises a buffer area for temporarily storing input data, and the second memory area comprises a main area for storing the data temporarily-stored in the first area.

9. An operating method of a data storage device including a nonvolatile memory device, the operating method comprising the steps of:
dividing a storage area of the nonvolatile memory device into a first memory area and a second memory area having a different program method from the first memory area;
deciding an optimized lifetime ratio (ORL) based on a limit wear level and an average wear level of the first memory area, and a limit wear level and an average wear level of the second memory area;
comparing the ORL to a reference value; and
changing a part of the first memory area to the second memory area or changing a part of the second memory area to the first memory area, according to the result of the step of comparing the ORL to the reference value.

10. The operating method according to claim 9, wherein the step of changing a part of the first memory area to the second memory area or changing a part of the second memory area to the first memory area comprises the step of changing a part of the second memory area to the first memory area, when the OLR is greater than the reference value.

11. The operating method according to claim 10, wherein the step of changing a part of the first memory area to the second memory area or changing a part of the second memory area to the first memory area comprises the step of selecting an area having a lower wear level than the average wear level of the second memory area from the second memory area.

12. The operating method according to claim 10, wherein the area changed into the first memory area from the second memory area is accessed in the manner of the first memory area.

13. The operating method according to claim 10, wherein the step of changing a part of the first memory area to the second memory area or changing a part of the second memory area to the first memory area comprises the steps of:
comparing the wear level of the area changed from the second memory area to the first memory area to the average wear level of the second memory area; and
when the wear level of the area changed to the first memory area is greater than the average wear level of the second memory area, changing the area changed to the first memory area to the second memory area.

14. The operating method according to claim 9, wherein the step of changing a part of the first memory area to the second memory area or changing a part of the second memory area to the first memory area comprises the step of changing a part of the first memory area to the second memory area when the ORL is less than the reference value.

15. The operating method according to claim 14, wherein the step of changing a part of the first memory area to the second memory area or changing a part of the second memory area to the first memory area comprises the step of selecting an area having a lower wear level than the average wear level of the second memory area from the first memory area.

16. The operating method according to claim 14, wherein the area changed into the second memory area from the first memory area is accessed in the manner of the second memory area.

17. The operating method according to claim 14, wherein the step of changing a part of the first memory area to the second memory area or changing a part of the second memory area to the first memory area comprises the steps of:
comparing the wear level of the area changed from the first memory area to the second memory area to the average wear level of the first memory area; and
when the wear level of the area changed to the second memory area is greater than the average wear level of the first memory area, changing the area changed to the second memory area to the first memory area.

18. The operating method according to claim 9, wherein the reference value is decided according to limit wear levels, an initial ratio, or degradation characteristics of the first memory area and the second memory area.

19. The operating method according to claim 9, wherein the number of bits stored in each of memory cells belonging to the first memory area is less than the number of bits stored in each of memory cells belonging to the second memory area, or the memory cell of the first memory area has a higher program speed or a higher limit wear level than the memory cell of the second memory area.

20. The operating method according to claim 19, wherein the first memory area comprises single level cells, and the second memory area comprises multi-level cells.

* * * * *